(12) United States Patent
Filipiak et al.

(10) Patent No.: US 12,307,102 B2
(45) Date of Patent: May 20, 2025

(54) APPARATUS WITH POST-MANUFACTURING DATA UPDATE MECHANISM AND METHODS FOR OPERATING THE SAME

(71) Applicant: Micron Technology, Inc., Boise, ID (US)

(72) Inventors: William C. Filipiak, Northville, MI (US); Elancheren Durai, Boise, ID (US); Quincy R. Holton, Kuna, ID (US); Adam Satar, Northville, MI (US); Brett Hunter, White Lake, MI (US); David R. Silwanowicz, Macomb, MI (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 18/651,032

(22) Filed: Apr. 30, 2024

(65) Prior Publication Data
US 2024/0281151 A1  Aug. 22, 2024

Related U.S. Application Data

(63) Continuation of application No. 17/865,203, filed on Jul. 14, 2022, now Pat. No. 12,001,686.

(51) Int. Cl.
*G11C 7/00* (2006.01)
*G06F 3/06* (2006.01)
(Continued)

(52) U.S. Cl.
CPC .......... *G06F 3/0619* (2013.01); *G06F 3/0659* (2013.01); *G06F 3/0679* (2013.01);
(Continued)

(58) Field of Classification Search
CPC . G11C 11/5628; G11C 16/10; G11C 16/0425; G11C 16/12; G11C 16/3468; G11C 11/5621; G11C 16/0433; G11C 11/5642; G11C 16/3486; G11C 2211/5624; G11C 29/50004; G11C 16/3404; G11C 11/5635; G11C 16/3459; G11C 2216/04; G11C 16/04; G11C 16/0441; G11C 16/26; G11C 2029/5004; G11C 2211/5613; G11C 29/02; G11C 29/021; G11C 29/028; G11C 29/50; G11C 16/16; G11C 16/28; G11C 16/3418; G11C 16/3436; G11C 16/3454; G11C 16/349; G11C 2029/0405; G11C 2029/0409; G11C 2029/4402;
(Continued)

(56) References Cited

U.S. PATENT DOCUMENTS

| | | | |
|---|---|---|---|
| 7,203,095 B2 * | 4/2007 | Ueda | G11C 16/12 365/185.28 |
| 11,501,837 B1 | 11/2022 | Prakash | |
| 2024/0020018 A1 | 1/2024 | Filipiak et al. | |

\* cited by examiner

*Primary Examiner* — Thong Q Le
(74) *Attorney, Agent, or Firm* — Perkins Coie LLP

(57) ABSTRACT

Methods, apparatuses and systems related to managing deck-specific read levels are described. The apparatus may include a memory array having the memory cells organized into two or more decks. The apparatus can determine a delay between programming the decks. The apparatus can derive and implement the deck-specific read levels by selectively adjusting a base read level with an offset level according to the delay and/or the targeted read location.

20 Claims, 6 Drawing Sheets

(51) Int. Cl.
  *G11C 7/04* (2006.01)
  *G11C 11/406* (2006.01)
  *G11C 16/34* (2006.01)
(52) U.S. Cl.
  CPC .......... *G11C 7/04* (2013.01); *G11C 11/40626* (2013.01); *G11C 16/3418* (2013.01)
(58) Field of Classification Search
  CPC .... G11C 2029/5002; G11C 2029/5006; G11C 2211/5621; G11C 29/04; G11C 29/06; G11C 29/24; G11C 29/4401; G11C 11/5671; G11C 16/0416; G11C 16/0483; G11C 16/30; G11C 16/34; G11C 16/3409; G11C 16/3431; G11C 16/3481; G11C 2029/0403; G11C 29/50016; G11C 16/00; G11C 16/06; G06F 3/0604; G06F 3/0652; G06F 3/0679; G06F 12/0246; G06F 2212/7206; G06F 2212/7208; H01L 29/42328; H01L 29/42324; H10B 41/35; H10B 41/41; H10B 69/00
  See application file for complete search history.

APPARATUS WITH POST-MANUFACTURING DATA UPDATE MECHANISM AND METHODS FOR OPERATING THE SAME

CROSS-REFERENCE TO RELATED APPLICATION(S)

This application is a continuation of U.S. patent application Ser. No. 17/865,203, filed Jul. 14, 2022, which is incorporated herein by reference in its entirety.

TECHNICAL FIELD

The disclosed embodiments relate to devices, and, in particular, to semiconductor memory devices with preloaded information and methods for operating the same.

BACKGROUND

Memory systems can employ memory devices to store and access information. The memory devices can include volatile memory devices, non-volatile memory devices (e.g., flash memory employing "NAND" technology or logic gates, "NOR" technology or logic gates, or a combination thereof), or a combination device. The memory devices utilize electrical energy, along with corresponding threshold levels or processing/reading voltage levels, to store and access data. However, the performance or characteristics of the memory devices change or degrade over time, usage, or environmental conditions. The change in performance or characteristics conflicts with the threshold or processing voltage levels over time, leading to errors and other performance issues.

BRIEF DESCRIPTION OF THE DRAWINGS

The foregoing and other objects, features, and advantages of the disclosure will be apparent from the following description of embodiments as illustrated in the accompanying drawings, in which reference characters refer to the same parts throughout the various views. The drawings are not necessarily to scale, emphasis instead being placed upon illustrating principles of the disclosure.

DETAILED DESCRIPTION

As described in greater detail below, the technology disclosed herein relates to an apparatus, such as memory systems, systems with memory devices, related methods, etc., for refreshing pre-loaded data after an environmental stimulus. As an illustrative example, a memory device (e.g., a NAND memory) may be preloaded with content, such as data and/or instructions, during (e.g., before the completion of) the manufacturing process. In some embodiments (e.g., automotive applications), the memory device may be pre-loaded before it is mounted or attached to another structure, such as via a reflow process. The temperature stress (e.g., around 250 degrees Celsius) associated with the reflow can cause changes in the retained charges (by, e.g., shifting the cell thresholds to the left or lower levels) that represent the preloaded content. As a result, the environmental stress caused by manufacturing can reduce the integrity of the preloaded content, reduce the retention capability for the preloaded content, and/or increase the error rate. Moreover, updating and replenishing the charges to refresh the preloaded content may take relatively long durations (e.g., 30 minutes or more) for each device. As such, blindly updating every memory device introduces inefficiencies and delays.

To improve the integrity of the preloaded content, embodiments of the technology described herein may include a mechanism configured to address the impact of the environmental stress on the preloaded content. The memory device can be configured to perform a scan according to a predetermined position to automatically and individually assess the impact of the actual/specific environmental stress on each device. In some embodiments, the memory device can analyze the scan results and notify a user that a refresh operation may be necessary. Additionally or alternatively, the memory device can permanently adjust read positions according to or in response to the impact of the environmental stress. In one or more embodiments, the memory device can use existing functions (via, e.g., background operations) to implement/schedule a refresh operation, such as by scheduling an additional earlier refresh operation or adjusting the natural refresh schedule to occur sooner. Accordingly, the memory device can address or reduce the impact of the environmental stress/stimulus, and thus reduce the corresponding negative effects. The memory device can effectively notify when a refresh may be required or automatically adjust the refresh overall, thereby automatically adjusting to different manufacturing conditions (e.g., without a separate human-performed condition-specific analysis).

Example Environment

Figure 1:
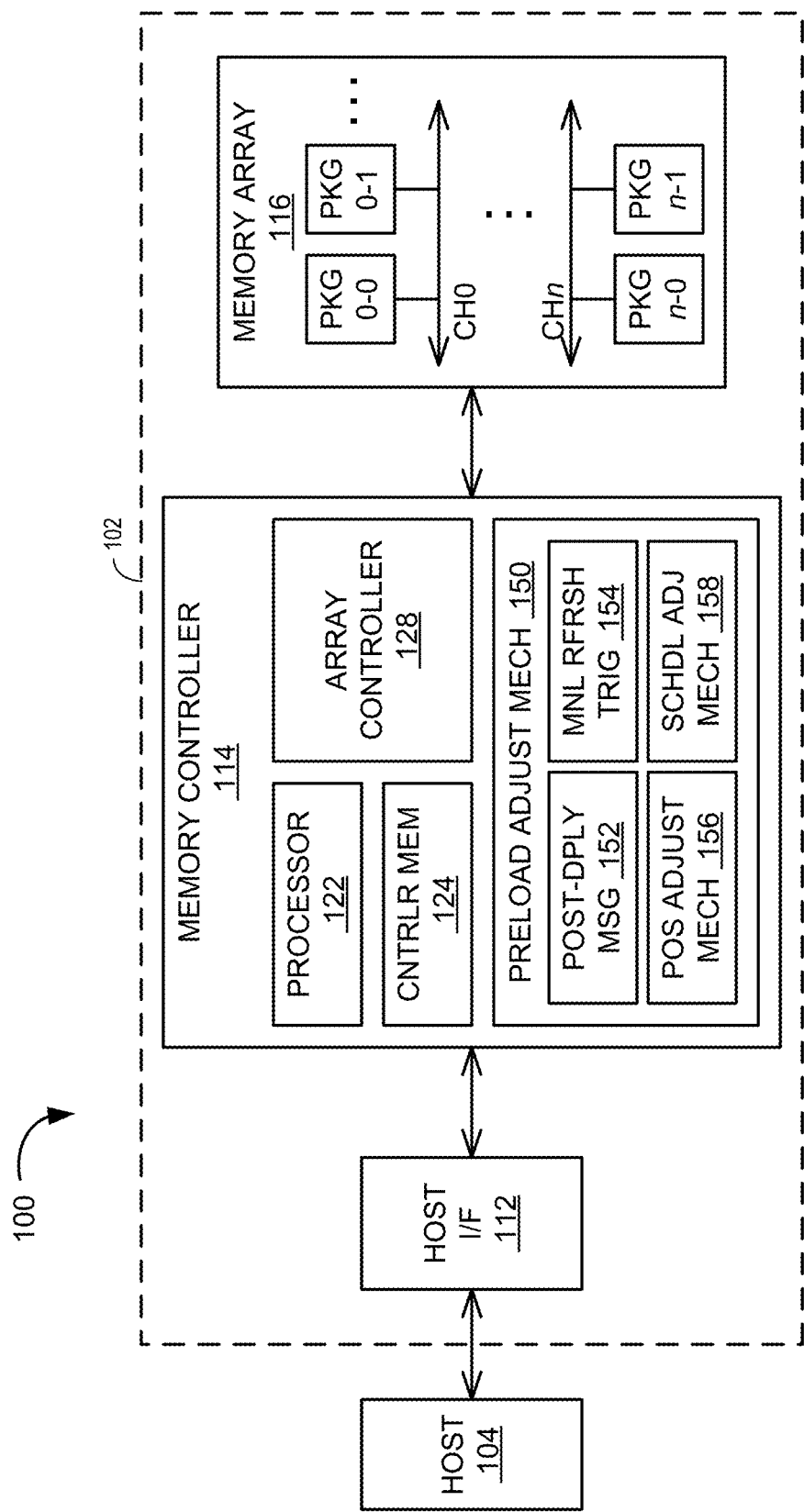
FIG. 1 is a block diagram of a computing system in accordance with an embodiment of the present technology.

FIG. 1 is a block diagram of a computing system 100 in accordance with an embodiment of the present technology. The computing system 100 can include a personal computing device/system, an enterprise system, a mobile device, a server system, a database system, a distributed computing system, or the like. The computing system 100 can include a memory system 102 coupled to a host device 104. The host device 104 can include one or more processors that can write data to and/or read data from the memory system 102. For example, the host device 104 can include an upstream central processing unit (CPU).

The memory system 102 can include circuitry configured to store data (via, e.g., write operations) and provide access to stored data (via, e.g., read operations). For example, the memory system 102 can include a persistent or non-volatile data storage system, such as a NAND-based Flash drive system, a Solid-State Drive (SSD) system, a SD card, or the like. In some embodiments, the memory system 102 can include a host interface 112 (e.g., buffers, transmitters, receivers, and/or the like) configured to facilitate communications with the host device 104. For example, the host interface 112 can be configured to support one or more host interconnect schemes, such as Universal Serial Bus (USB), Peripheral Component Interconnect (PCI), Serial AT Attachment (SATA), or the like. The host interface 112 can receive commands, addresses, data (e.g., write data), and/or other information from the host device 104. The host interface 112 can also send data (e.g., read data) and/or other information to the host device 104.

The memory system 102 can further include a memory controller 114 and a memory array 116. The memory array 116 can include memory cells that are configured to store a unit of information. The memory controller 114 can be configured to control the overall operation of the memory system 102, including the operations of the memory array 116.

In some embodiments, the memory array 116 can include a set of NAND Flash devices or packages. Each of the packages can include a set of memory cells that each store data in a charge storage structure. The memory cells can include, for example, floating gate, charge trap, phase change, ferroelectric, magnetoresitive, and/or other suitable storage elements configured to store data persistently or semi-persistently. The memory cells can be one-transistor memory cells that can be programmed to a target state to represent information. For instance, electric charge can be placed on, or removed from, the charge storage structure (e.g., the charge trap or the floating gate) of the memory cell to program the cell to a particular data state. The stored charge on the charge storage structure of the memory cell can indicate a threshold voltage (Vt) of the cell. For example, a single level cell (SLC) can be programmed to a targeted one of two different data states, which can be represented by the binary units 1 or 0. Also, some flash memory cells can be programmed to a targeted one of more than two data states. Multilevel cells (MLCs) may be programmed to any one of four data states (e.g., represented by the binary 00, 01, 10, 11) to store two bits of data. Similarly, triple level cells (TLCs) may be programmed to one of eight (i.e., 23) data states to store three bits of data, and quad level cells (QLCs) may be programmed to one of 16 (i.e., 24) data states to store four bits of data.

Such memory cells may be arranged in rows (e.g., each corresponding to a word line 143) and columns (e.g., each corresponding to a bit line). The arrangements can further correspond to different groupings for the memory cells. For example, each word line can correspond to one or more memory pages. Also, the memory array 116 can include memory blocks that each include a set of memory pages. In operation, the data can be written or otherwise programmed (e.g., erased) with regards to the various memory regions of the memory array 116, such as by writing to groups of pages and/or memory blocks. In NAND-based memory, a write operation often includes programming the memory cells in selected memory pages with specific data values (e.g., a string of data bits having a value of either logic 0 or logic 1). An erase operation is similar to a write operation, except that the erase operation re-programs an entire memory block or multiple memory blocks to the same data state (e.g., logic 0).

While the memory array 116 is described with respect to the memory cells, it is understood that the memory array 116 can include other components (not shown). For example, the memory array 116 can also include other circuit components, such as multiplexers, decoders, buffers, read/write drivers, address registers, data out/data in registers, etc., for accessing and/or programming (e.g., writing) the data and for other functionalities.

As described above, the memory controller 114 can be configured to control the operations of the memory array 116. The memory controller 114 can include a processor 122, such as a microcontroller, special purpose logic circuitry (e.g., a field programmable gate array (FPGA), an application specific integrated circuit (ASIC), etc.), or other suitable processor. The processor 122 can execute instructions encoded in hardware, firmware, and/or software (e.g., instructions stored in controller-embedded memory 124 to execute various processes, logic flows, and routines for controlling operation of the memory system 102 and/or the memory array 116.

Further, the memory controller 114 can further include an array controller 128 that controls or oversees detailed or targeted aspects of operating the memory array 116. For example, the array controller 128 can provide a communication interface between the processor 122 and the memory array 116 (e.g., the components therein). The array controller 128 can function as a multiplexer/demultiplexer, such as for handling transport of data along serial connection to flash devices in the memory array 116.

In some implementations, the memory system 102 may be preloaded with information prior to an environmental stimulus. For example, the memory system 102 or the corresponding memory array 116 may be preloaded with information prior to a completion of a manufacturing process. Accordingly, the memory array 116 can include the preloaded data in the rewritable (e.g., Flash) memory cells prior to an anticipated stimulus (e.g., increased temperature for reflowing solder) that may affect and potentially corrupt the preloaded data.

The memory system 102 can include a preload adjustment mechanism 150 (e.g., circuits, software instructions, firmware configuration, or the like) configured to address or offset the effect of the anticipated stimulus on the preloaded information. For example, the preload adjustment mechanism 150 can be configured to scan the memory cells to assess the impact on the preloaded information following the stimulus. Based on the assessment, the preload adjustment mechanism 150 can generate a post-deployment message 152 to notify a user or a customer that a refresh or an adjustment may be required for the preloaded information. The preload adjustment mechanism 150 can include a manual refresh trigger 154 that allows the user and/or the controller 114 to initiate the refresh operation, such as in response to the post-deployment message 152. Additionally or alternatively, the preload adjustment mechanism 150 can include a read-position adjustment mechanism 156 (e.g., circuits, software instructions, firmware configuration, or the like) configured to adjust the read positions, such as by shifting or lowering an initially provided set of read positions for the preloaded information. In one or more embodiments, the preload adjustment mechanism 150 can include a scheduling adjustment mechanism 158 (e.g., circuits, software instructions, firmware configuration, or the like) configured to use existing functions to additionally schedule a refresh operation to address or offset the effects of the environmental stimulus. Details regarding the preload adjustment mechanism 150 are described below.

Environmental Stimulus

To illustrate the context regarding the preload adjustment mechanism 150, one example can include a supplier providing the memory system 102 or the memory array 116 to a customer that further integrates the supplied system/array to a different structure or product (e.g., an automotive vehicle or electronic systems therein). The supplier and/or the customer can preload the supplied system/array with the content prior to the integration, which can introduce the environmental stimulus and affect the preloaded content.

Figure 2A:
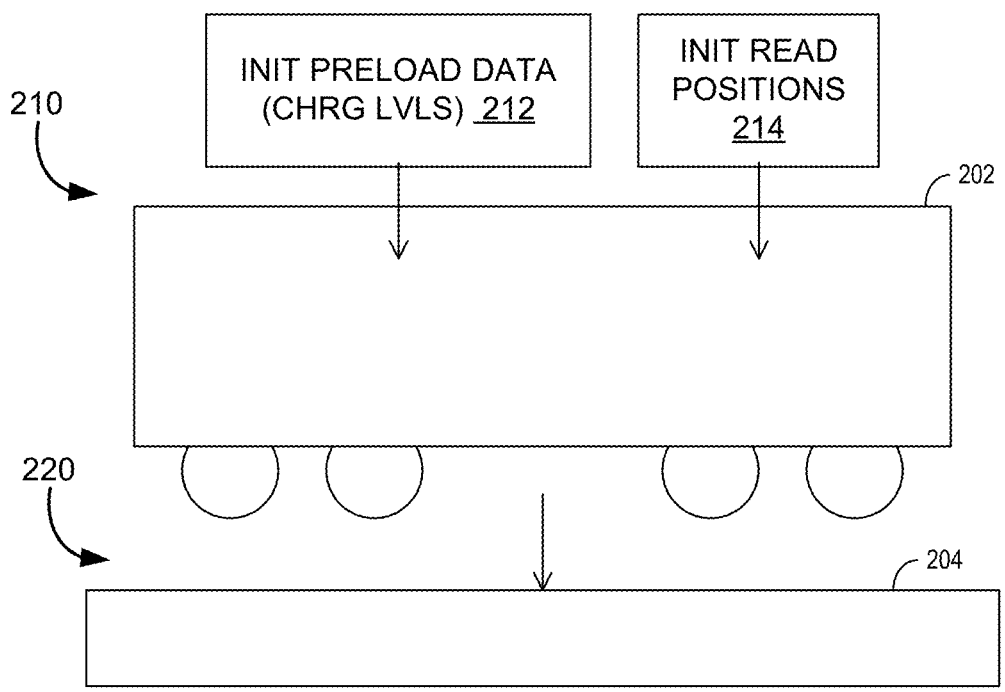
FIG. 2A and FIG. 2B are illustrations of example manufacturing operations in accordance with an embodiment of the present technology.
Figure 2B:
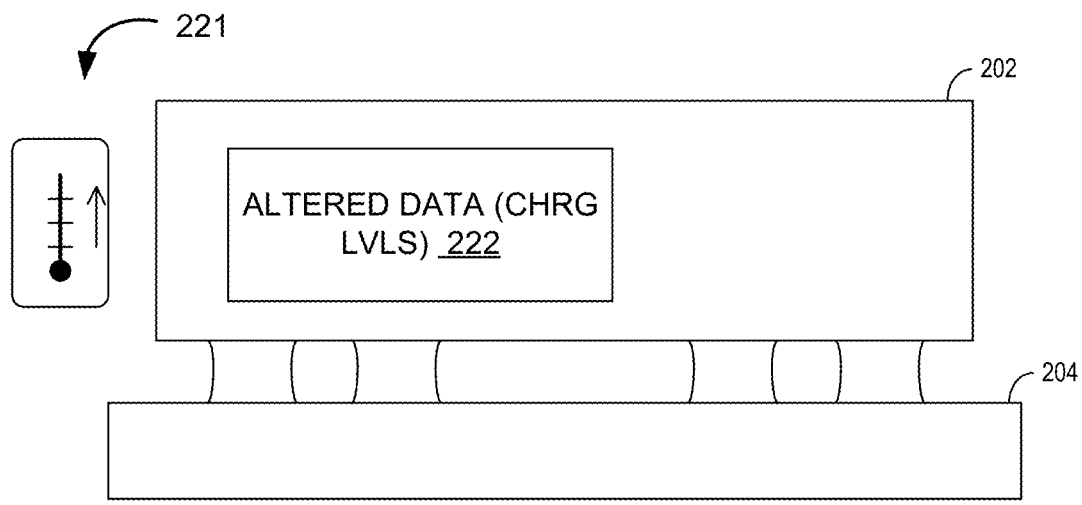

FIG. 2A and FIG. 2B are illustrations of example manufacturing operations in accordance with an embodiment of the present technology. Referring to FIGS. 2A and 2B together, the process for manufacturing the computing system 100 of FIG. 1 and/or the memory system 102 of FIG. 1 can include integrating (via, e.g., manipulating and attaching) a semiconductor device 202 (e.g., the memory array 116 of FIG. 1) to a substrate 204 (e.g., a printed circuit board (PCB), another semiconductor device, a separate electronic system, or a similar structure).

The manufacturing process can include a preloading operation 210 prior to the integration. The preloading operation 210 can be for storing initial preload data 212 onto the memory array 116 (e.g., the rewritable memory cells therein), such as using a separate loading system. The preloading operation 210 can further correspond to configuring the memory array 116 and/or the memory system 102 with initial read positions 214 used to read or access the initial preload data 212 and/or other stored data.

Following the preloading operation 210, the memory array 116 with the initial preload data 212 may be manipulated during integration. For example, the customer can implement an integration operation 220 to attach or mount the preloaded semiconductor device 202 to the substrate 204. The integration operation 220 can include an environmental stimulus 221, such as increased temperature (e.g., 250 degrees Celsius) for a reflow operation. The customer can use the increased temperature to reflow solder in physically and/or electrically connecting the preloaded semiconductor device 202 to the substrate 204 and electrical connections/components therein.

The environmental stimulus 221 can affect or alter the initial preload data 212. For example, the increased temperature can alter the charges stored in the rewritable/Flash memory cells in the memory array 116. Accordingly, the corresponding data bits for the initial preload data 212 can be altered or corrupted, thereby changing into altered data 222.

Altered Data

Figure 3A:
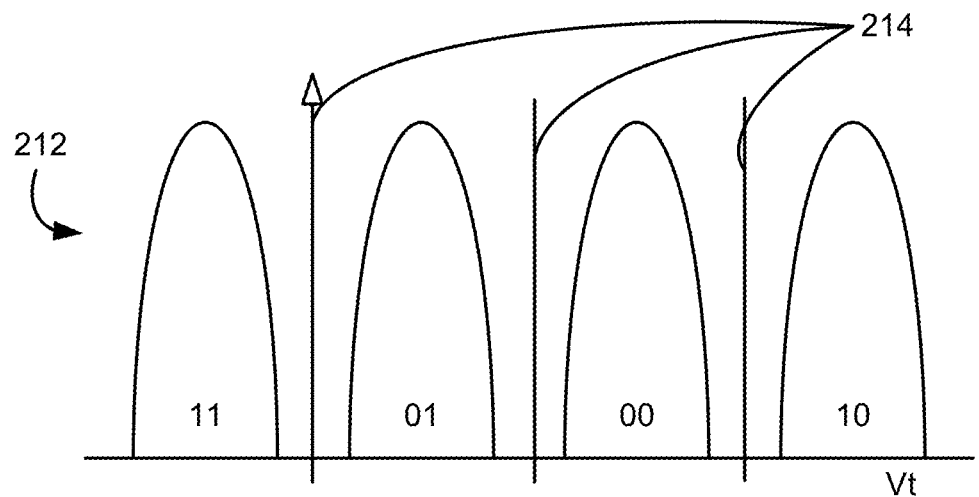
FIG. 3A and FIG. 3B are illustrations of changes in stored charge levels before and after environmental stimulus.
Figure 3B:
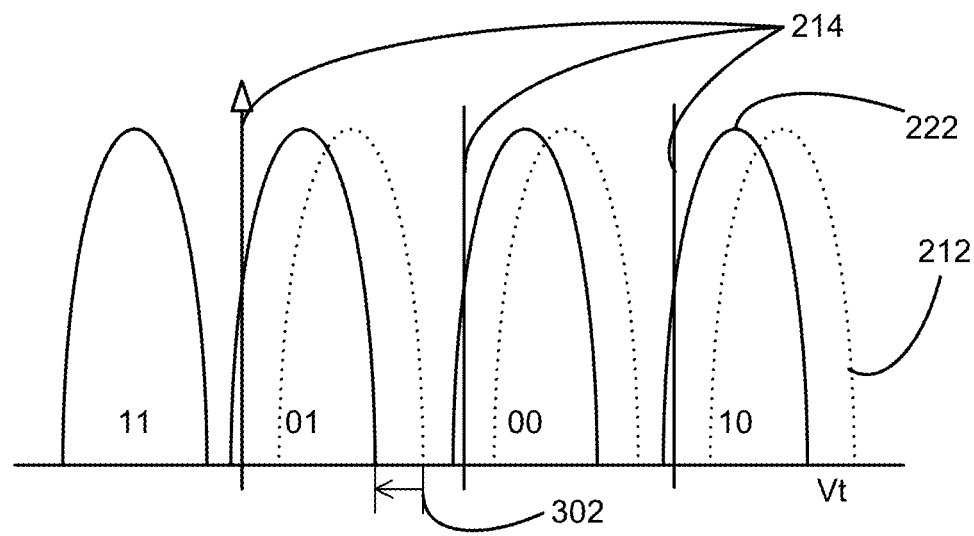

FIG. 3A and FIG. 3B are illustrations of such changes in stored charge levels before and after environmental stimulus. FIG. 3A can illustrate the Vt associated with the stored charges that correspond to the initial preload data 212. FIG. 3A can illustrate the distribution of the Vt for various bit values '11,' '1,' '00,' and '10.' The initial read positions 214 can be between the Vt for the different bit values. Thus, the initial read positions 214 can be used to accurately identify the Vt as the corresponding/intended bit values.

FIG. 3B can illustrate the Vt associated with the stored charges that correspond to the altered data 222. The altered data 222 can correspond to the stored charges that have shifted left (via, e.g., charge loss due to increased temperatures) by a data adjustment 302 from the initial levels of the stored charges illustrated in FIG. 3A. As a result, the stored charge levels can effectively move across the initial read positions 214, thereby changing the represented bits from the initial preload data 212 to the altered data 222.

Addressing Altered Data

As described above, the memory system 102 can include the preload adjustment mechanism 150 of FIG. 1 configured to address such real-time changes in the initial preload data 212. In other words, the preload adjustment mechanism 150 can effectively assess the unique amount/degree of the shift in the stored charges and implement one or more actions to accurately recover or provide the initial preload data 212.

Figure 4:
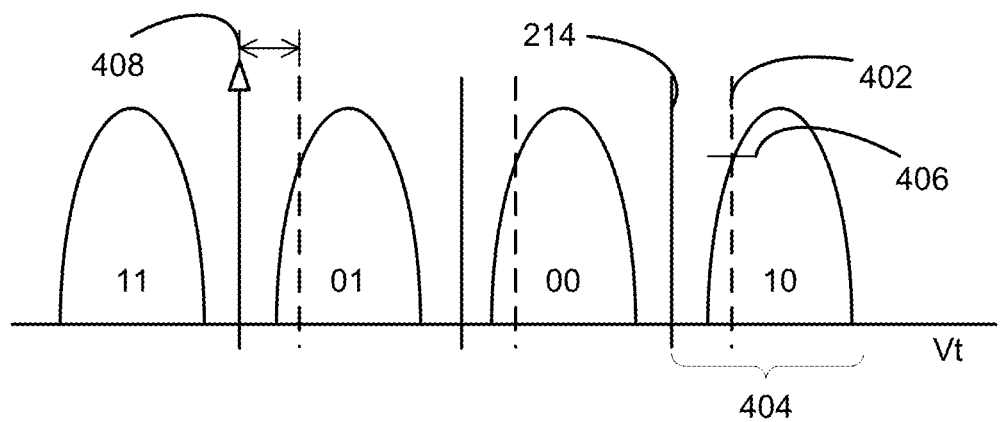
FIG. 4 is an illustration of scan-read positions in accordance with an embodiment of the present technology.

The environmental stimulus 221 can be predictable, and the memory system 102 can include the scan-read positions 402 configured to address the predictable stimulus. As illustrated in FIG. 4, the scan-read positions 402 can be greater than the initial read positions 214 representing a floor threshold for the the corresponding bit values 404. Accordingly, the memory system 102 can assess the changes in the Vt caused by the increased temperatures. If the predicted stimulus can have a different effect, the memory system 102 can include the scan-read positions 402 configured for (e.g., more than one scan-read positions for each bit value and/or offset from a ceiling threshold) the predicted stimulus.

The scan-read positions 402 can have a scan-read offset 408 relative to a referenced read position (e.g., floor or ceiling) for the corresponding bit value. Increased values of the scan-read offset 408 can provide increased accuracy in assessing the data adjustment 302. For example, when scanning, using Vt that is too close to the floor threshold can result in scanning the guard band (e.g., intended separation in the Vt to avoid misreads) or return low counts that are indistinguishable from noise parameters. However, given the convex parabolic shape of the Vt distribution, excessive value of the scan-read offset 408 can result in scanning past the apex of the distribution. As such, the memory system 102 that is expecting to assess the shift using the left side of the distribution pattern may inaccurately scan the opposite side when the scan-read offset 408 is too high. In some embodiments, the memory system 102 can use the scan-read positions 402 that have been preset and selected to remain on one portion of the distribution pattern across the data adjustment 302. In one or more embodiments, the memory system 102 can include multiple scan-read positions 402 for each bit value 404 to effectively assess the overall distribution shape across the data adjustment 302. In other embodiments, the memory system 102 can dynamically adjust the scan-read offset 408 according to (1) a user input (e.g., customer provided temperature level) that describes the environmental stimulus 221 or (2) a real-time measurement provided by a sensor (not shown) on the memory system 102.

As an example of the assessment operation, FIG. 4 is an illustration of scan-read positions 402 in accordance with an embodiment of the present technology. The memory system 102 can include one or more scan-read positions 402 for each bit value 404. The scan-read positions 402 can be configured for assessing the impact of the environmental stimulus 221 on the stored charges for the corresponding bit value 404. In some embodiments, the memory system 102 can scan the memory array 116 or a portion thereof using the scan-read positions 402 to generate a shift measure 406, such as a count or a number of cells having Vt at, below, and/or above the scan-read positions 402. The memory system 102 can use the shift measure 406 to assess or estimate the data adjustment 302 (e.g., a degree/amount of shift or loss in the stored charges).

The memory system 102 can use the shift measure 406 to take actions configured to address the data adjustment 302. For example, the memory system 102 can compare the shift measure 406 to one or more thresholds to determine whether the data adjustment 302 is negligible or sufficient enough (e.g., the shift measure 406 exceeding one or more thresholds when analyzing the left/rising portion of the Vt distribution) to require one or more response. In one or more embodiments, the memory system 102 can generate/communicate the post-deployment message 152 of FIG. 1 to notify the user of the data adjustment 302. Accordingly, the memory system 102 can notify the user that the memory array 116 includes the altered data 222 instead of the initial preload data 212 and that a refresh operation or another response action is necessary to access or recover the initial preload data 212. The memory system 102 can provide features, such as the manual refresh trigger 154 of FIG. 1, that enable the user to address/correct the data adjustment 302 in response to the post-deployment message 152.

Figure 5:
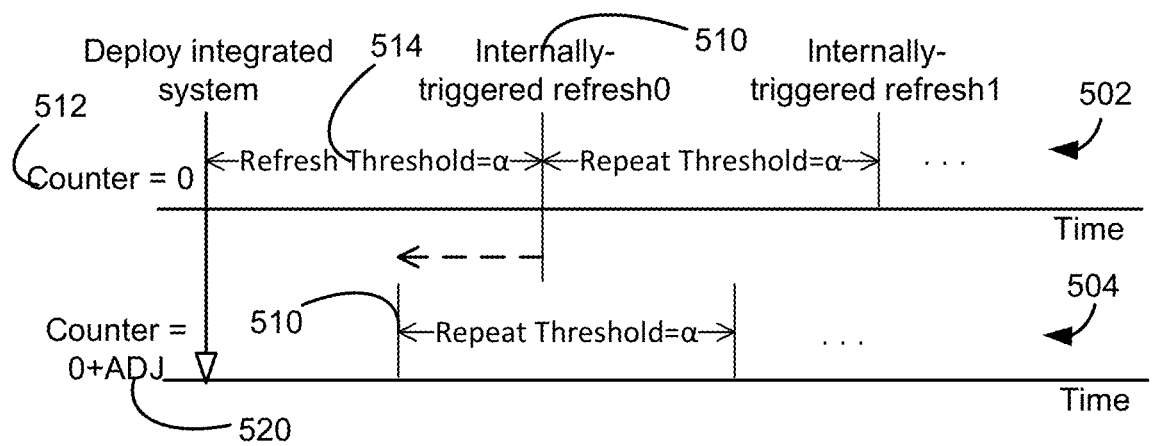
FIG. 5 is an illustration of an example adjustment to a refresh schedule in accordance with an embodiment of the present technology.

In some embodiments, the memory system 102 can take automatic actions to address the data adjustment 302 in addition to or instead of notifying the user. For example, the memory system 102 can implement the scheduling adjustment mechanism 158 of FIG. 1 that leverages existing features, such as existing refresh operations and scheduling of such operations, to address the data adjustment 302. FIG. 5 is an illustration of an example adjustment to a refresh schedule in accordance with an embodiment of the present technology. A first schedule 502 illustrates the refresh schedule without any adjustments, and a second schedule 504 illustrates the refresh schedule as adjusted per the scheduling adjustment mechanism 158.

As illustrated in FIG. 5, the memory system 102 can include an existing memory refresh mechanism (e.g., circuits, instructions, firmware configurations, or the like) that periodically refresh the data/charges stored in the memory array 116 (e.g., rewritable/Flash cells). In some embodiments, the memory system 102 can be configured to track an operation count 512, such as by incrementing a counter for received commands and/or implemented operations of a targeted type. For example, the memory system 102 can use the operation count 512 to track the number of reads, writes, activations, or the like for corresponding group of memory cells. The memory system 102 can initiate the refresh operation when the operation count 512 reaches or satisfies a refresh condition 514 (e.g., a predetermined threshold number). Upon initiating the refresh operation, the memory system 102 can reset the operation count 512 to a predetermined value (e.g., 0).

For the first schedule 502 or without the scheduling adjustment mechanism 158, the operation count 512 can be initialized to the reset value when the memory system 102 is deployed or released for intended use. Accordingly, a first instance 510 of the internally triggered refresh operation can occur when actual number of implemented memory operations satisfies the refresh condition 514. In contrast, for the second schedule 504, the scheduling adjustment mechanism 158 can load the operation count 512 with a scheduling adjustment 520. Effectively, the scheduling adjustment mechanism 158 can use the scheduling adjustment 520 to implement the first refresh 510 at an earlier time. In other words, the scheduling adjustment mechanism 158 can use the scheduling adjustment 520 to make the first refresh 510 occur earlier than the first schedule 502 to account for the data adjustment 302.

In some embodiments, the scheduling adjustment mechanism 158 can use the scheduling adjustment 520 that has been predetermined. In other embodiments, the scheduling adjustment mechanism 158 can dynamically generate or calculate the scheduling adjustment 520 based on the shift measure 406 of FIG. 4.

Figure 6:
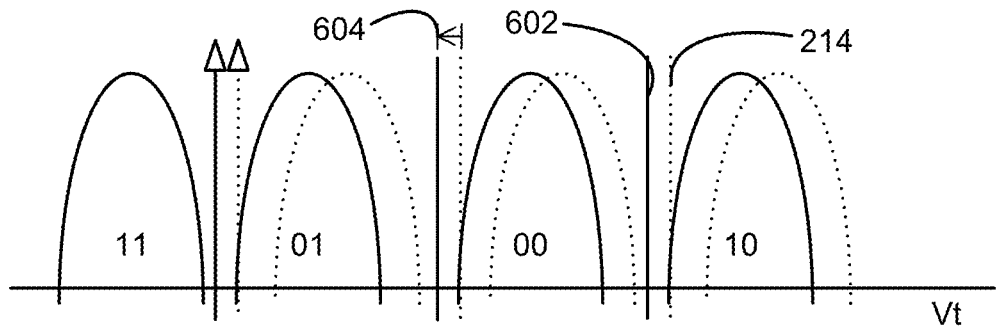
FIG. 6 is an illustration of adjusted read positions in accordance with an embodiment of the present technology.

Additionally or alternatively, the preload adjustment mechanism 150 can include the read-position adjustment mechanism 156 configured to adjust the read positions to account for the data adjustment 302. FIG. 6 is an illustration of adjusted read positions 602 in accordance with an embodiment of the present technology. The adjusted read positions 602 can replace the initial read positions 214, such as when the shift measure 406 satisfies one or more conditions/thresholds. In some embodiments, the memory system 102 can generate the adjusted read positions 602 according to one or more predetermined position offsets 604. In other embodiments, the memory system 102 can dynamically calculate the position offsets 604 according to the shift measure 406, such as using a predetermined method or equation. In some embodiments, the position offsets 604 can match or be a scaled derivative of the shift measure 406. The memory system 102 can apply or adjust the position offsets 604 to the initial read positions 214 to generate the adjusted read positions 602.

In some embodiments, the preload adjustment mechanism 150 can combine two or more of the post-deployment message 152, the manual refresh trigger 154, the read-position adjustment mechanism 156, and the scheduling adjustment mechanism 158. For example, the memory system 102 can implement the scheduling adjustment mechanism 158 as a first option (e.g., when the shift measure 406 is below a first threshold). When the shift measure is greater than such first threshold, the memory system 102 can implement the read-position adjustment mechanism 156, the post-deployment message 152, the manual refresh trigger 154, or a combination thereof. In some embodiments, the post-deployment message 152 and the manual refresh trigger 154 can be implemented when the shift measure 406 is relatively severe (e.g., greater than thresholds for other mechanisms) and requires immediate refresh operation.

Control Flow

Figure 7:
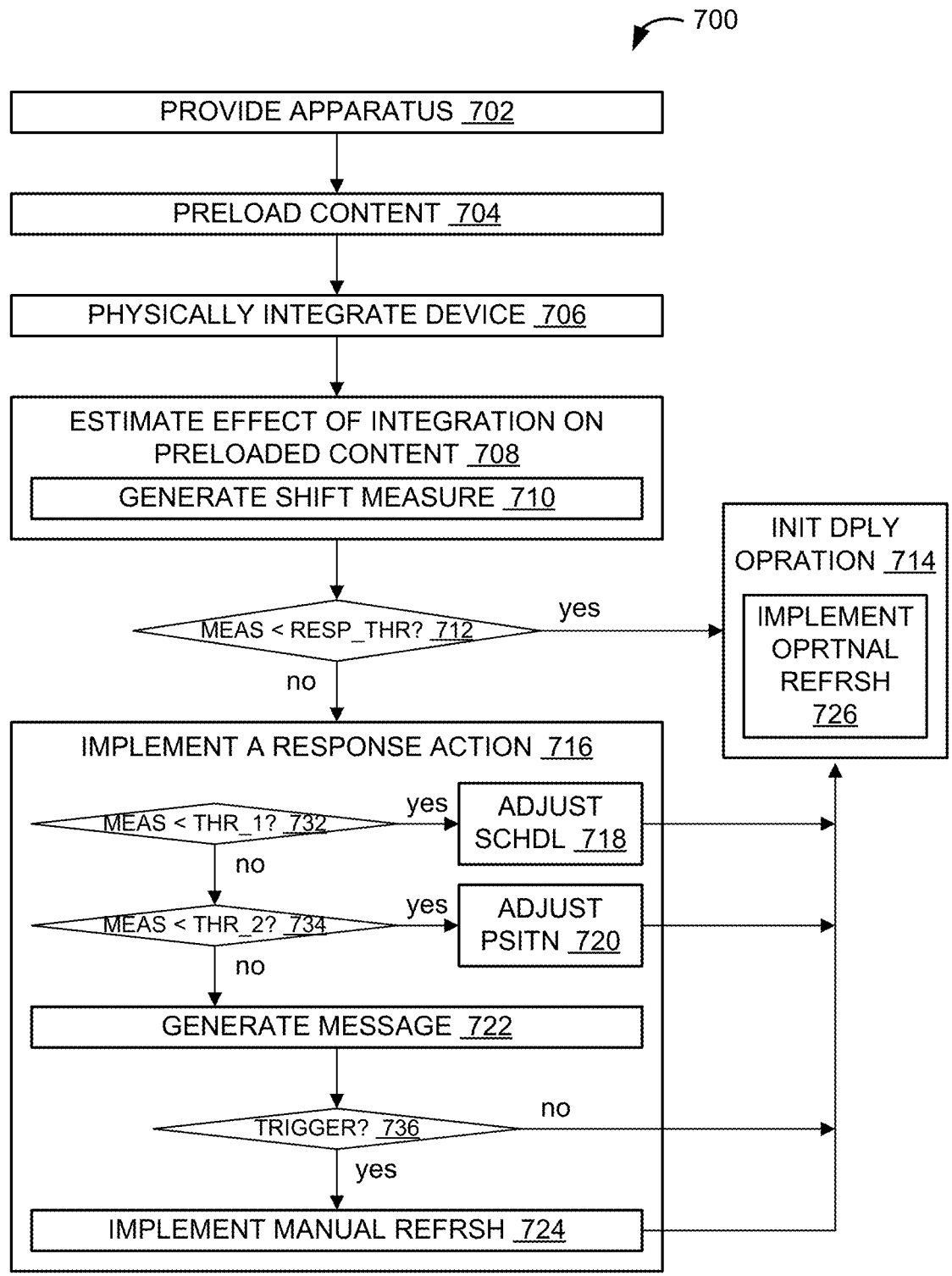
FIG. 7 is a flow diagram illustrating an example method of manufacturing/operating an apparatus in accordance with an embodiment of the present technology.

FIG. 7 is a flow diagram illustrating an example method 700 of manufacturing/operating an apparatus (e.g., the computing system 100, the memory system 102, and/or the memory controller 114 all illustrated in FIG. 1) in accordance with an embodiment of the present technology. The method 700 can be for implementing the preload adjustment mechanism 150 of FIG. 1.

The method 700 can include providing the apparatus (e.g., the memory system 102 and/or the memory array 116 of FIG. 1) at block 702. At block 704, the apparatus can be preloaded with content, such as via the preloading operation 210 of FIG. 2A. At block 706, the preloaded apparatus can be integrated to an external system/structure (e.g., the substrate 204 of FIG. 2A), such as via the integration operation 220 of FIG. 2A. For example, the customer of the apparatus can use the environmental stimulus 221 (e.g., increased temperatures) to attach the memory system 102 or the memory array 116 to the substrate 204, such as by reflowing solder or other connectors.

At block 708, the apparatus can automatically estimate the effect(s) of the integration on the preloaded content. For example, the memory system 102 and/or the memory array 116 can scan the memory array 116 using the scan-read positions 402 of FIG. 4 as described above. As a result, the apparatus can generate the shift measure 406 of FIG. 4 as illustrated in block 710.

At decision block 712, the apparatus can compare the shift measure 406 to a response threshold. When the shift measure 406 is less than the response threshold, the apparatus can initiate deployment operations (e.g., normal operating mode) as illustrated in block 714. Otherwise, when the shift measure 406 meets or exceeds the response threshold, the apparatus can implement a response action as illustrated in block 716. The apparatus can use the response action to address the effect(s) of the integration operation.

Some examples of the response action(s) can include adjusting a refresh schedule as illustrated at block 718, adjusting the read position as illustrated at block 720, generating a message as illustrated at block 722 and providing an option to implement a manual refresh as illustrated at block 724, or a combination thereof. For the schedule adjustment, the apparatus can use the scheduling adjustment mechanism 158 of FIG. 1, the scheduling adjustment 520 of FIG. 5, or the like as described above. Accordingly, the apparatus can adjust the timing of operational refresh events (illustrated in block 726) that would occur during the deployed/normal operation. The first implementation of the operational refresh can occur at an earlier time as a result of the adjustment. For the position adjustment, the apparatus can use the position adjustment mechanism 156 of FIG. 1, the adjusted read positions 602 of FIG. 6, the position offsets 604 of FIG. 6, or the like as described above. The apparatus can generate the post-deployment message 152 of FIG. 1 and use the manual refresh trigger 154 to implement the manual refresh.

In some embodiments, the apparatus can combine two or more response actions and selectively implement one of the actions according to the shift measure 406. For example, the apparatus can adjust the schedule when the shift measure 406 is less than a scheduling threshold as illustrated in decision block 732. When the shift measure 406 meets or exceeds the scheduling threshold, the apparatus can perform a different response action, such as by adjusting the read position and/or by generating the message. The apparatus can adjust the read position when the shift measure 406 is less than a position threshold as illustrated in decision block 734. Otherwise, when the shift measure 406 meets or exceeds the position threshold, the apparatus can generate the message. The apparatus can implement the manual refresh when the user activates the refresh trigger as illustrated in decision block 736.

Figure 8:
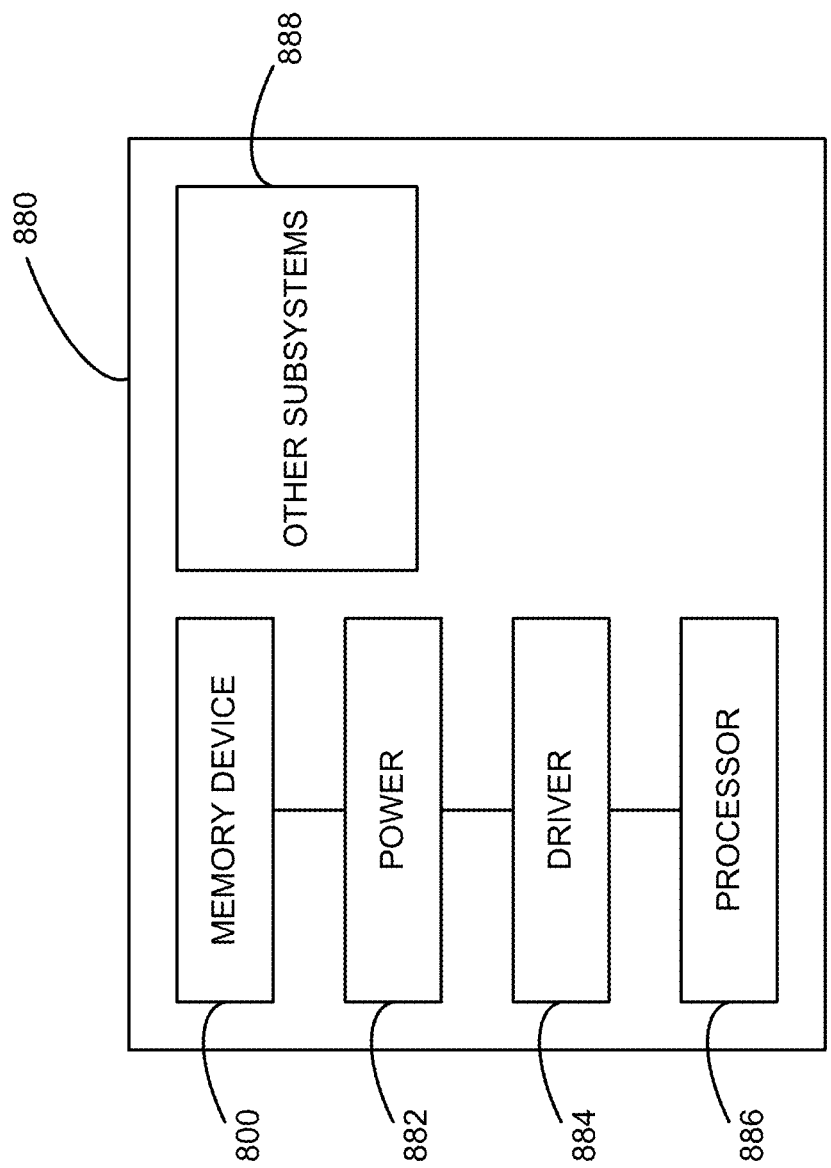
FIG. 8 is a schematic view of a system that includes an apparatus in accordance with an embodiment of the present technology.

FIG. 8 is a schematic view of a system that includes an apparatus in accordance with embodiments of the present technology. Any one of the foregoing apparatuses (e.g., memory devices) described above with reference to FIGS. 1-7 can be incorporated into any of a myriad of larger and/or more complex systems, a representative example of which is system 880 shown schematically in FIG. 8. The system 880 can include a memory device 800, a power source 882, a driver 884, a processor 886, and/or other subsystems or components 888. The memory device 800 can include features generally similar to those of the apparatus described above with reference to one or more of the FIGS., and can therefore include various features for performing a direct read request from a host device. The resulting system 880 can perform any of a wide variety of functions, such as memory storage, data processing, and/or other suitable functions. Accordingly, representative systems 880 can include, without limitation, hand-held devices (e.g., mobile phones, tablets, digital readers, and digital audio players), computers, vehicles, appliances and other products. Components of the system 880 may be housed in a single unit or distributed over multiple, interconnected units (e.g., through a communications network). The components of the system 880 can also include remote devices and any of a wide variety of computer readable media.

From the foregoing, it will be appreciated that specific embodiments of the technology have been described herein for purposes of illustration, but that various modifications may be made without deviating from the disclosure. In addition, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

In the illustrated embodiments above, the apparatuses have been described in the context of NAND Flash devices. Apparatuses configured in accordance with other embodiments of the present technology, however, can include other types of suitable storage media in addition to or in lieu of NAND Flash devices, such as, devices incorporating NOR-based non-volatile storage media (e.g., NAND flash), magnetic storage media, phase-change storage media, ferroelectric storage media, dynamic random access memory (DRAM) devices, etc.

The term "processing" as used herein includes manipulating signals and data, such as writing or programming, reading, erasing, refreshing, adjusting or changing values, calculating results, executing instructions, assembling, transferring, and/or manipulating data structures. The term data structure includes information arranged as bits, words or code-words, blocks, files, input data, system-generated data, such as calculated or generated data, and program data. Further, the term "dynamic" as used herein describes processes, functions, actions or implementation occurring during operation, usage, or deployment of a corresponding device, system or embodiment, and after or while running manufacturer's or third-party firmware. The dynamically occurring processes, functions, actions or implementations can occur after or subsequent to design, manufacture, and initial testing, setup or configuration.

The above embodiments are described in sufficient detail to enable those skilled in the art to make and use the embodiments. A person skilled in the relevant art, however, will understand that the technology may have additional embodiments and that the technology may be practiced without several of the details of the embodiments described above with reference to one or more of the FIGS. described above.

We claim:

1. A memory device, comprising:
    a memory array including rewritable memory cells configured to store initial levels of charges representative of preloaded data; and
    a memory controller operably coupled to the memory array and configured to:
        scan the rewritable memory cells after an environmental stimulus to determine one or more changes in the initial levels of the stored charges, wherein the rewritable memory cells are scanned using a voltage that is offset from an initial read position initially targeted for reading the preloaded data; and
        based on the one or more changes in the initial levels, selectively generate a post-deployment message for notifying a user that the preloaded data requires refreshing after the environmental stimulus.

2. The memory device of claim 1, wherein:
    the rewritable memory cells are scanned after one or more manufacturing steps that occur after the preloading the data; and
    the memory controller is configured to dynamically generate, based on the scan, a shift measure that represents the or more changes in the preloaded data and corresponds to an estimate of charge loss caused by the one or more manufacturing steps.

3. The memory device of claim 1, wherein the memory controller is configured to address the one or more changes through the selectively generated post-deployment message.

4. The memory device of claim 1, wherein the offset voltage used for the scan corresponds to a floor threshold for a corresponding bit level.

5. The memory device of claim 1, wherein the memory controller is further configured to:
based on scanning, determine that the rewritable memory cells have altered data stored therein, wherein the altered data corresponds to the preloaded data that has been corrupted due to the one or more changes in the initial levels of stored charges; and
selectively generate the post-deployment message for notifying the user that the preloaded data has been corrupted.

6. The memory device of claim 1, wherein the memory controller is further configured to provide a manual refresh trigger for allowing the user to initiate a refresh operation that restores the stored charges to the initial levels to refresh the preloaded data.

7. The memory device of claim 1, wherein the memory controller is further configured to:
periodically trigger a refresh operation that refresh charges stored in the memory array; and
based on the one or more changes in the initial levels, selectively adjust a first implementation for the periodic refresh operation independent of or in addition to a periodic condition for the refresh operation.

8. The memory device of claim 7, wherein selectively adjusting the first implementation includes reducing a delay until the first implementation of the refresh operation scheduled to occur during post-deployment operation of the memory device.

9. The memory device of claim 7, wherein the memory controller is further configured to respond to the one or more changes in the initial level by selecting from a response set that includes:
when the shift measure is within a first range, shortening a delay for the periodic refresh operation that is configured to occur during deployed operation of the memory device; and
when the shift measure is within a second range, generating the post-deployment message, wherein the second range represents a greater charge loss than the first range.

10. The memory device of claim 1, wherein the memory controller is further configured to generate an adjusted read position based on the one or more changes in the initial levels, wherein the adjusted read position is configured for use instead of the initial read position in reading the preloaded data.

11. A method of manufacturing a memory device having rewritable memory cells, the method comprising:
preloading content on the memory device by storing initial levels of charges in the rewritable memory cells;
after preloading the content, performing at least one manufacturing step that manipulates a physical structure housing the rewritable memory cells;
after performing the at least one manufacturing step, scanning the rewritable memory cells to determine one or more changes in the initial levels of the stored charges, wherein the rewritable memory cells are scanned using a threshold voltage different from an initial read position initially targeted for reading the preloaded data; and
dynamically generating a post-deployment message based on the shift measure for notifying a user that the preloaded data has been corrupted by the environmental stimulus.

12. The method of claim 11, further comprising:
providing a manual refresh trigger for allowing the user to selectively initiate a refresh operation to address the one or more changes in the initial levels.

13. The method of claim 11, further comprising:
implementing a refresh operation earlier than a predetermined schedule, wherein the refresh operation is configured to be periodically implemented during post deployment operation of the memory device to refresh charges stored in the memory array.

14. The method of claim 13, implementing the refresh operation earlier than the predetermined schedule includes increasing an initial value of an operation count representative of a number of performed memory access and/or activation operations, wherein the operation count is configured to control the periodic implementation of the refresh operation.

15. A method of operating a memory device that includes rewritable memory cells having initial levels of stored charges representative of preloaded data, the method comprising:
scanning the rewritable memory cells after a manufacturing process to determine one or more changes in the initial levels of the stored charges, wherein the rewritable memory cells are scanned using a voltage different from an initial read position initially targeted for reading the preloaded data; and
implementing a response action based on the shift measure to address the one or more changes in the initial levels.

16. The method of claim 15, wherein implementing the response action includes dynamically generating a post-deployment message for notifying a user that the preloaded data has been corrupted by the environmental stimulus.

17. The method of claim 15, wherein implementing the response action includes providing a manual refresh trigger that allows the user to selectively initiate a refresh operation for recovering the preloaded data.

18. The method of claim 15, wherein implementing the response action includes implementing a refresh operation ahead of a predetermined schedule, wherein the refresh operation is configured to be periodically implemented during post deployment operation of the memory device to refresh charges stored in the memory array.

19. The method of claim 18, wherein implementing the refresh operation ahead of the predetermined schedule includes increasing an initial value of an operation count representative of a number of performed memory access and/or activation operations, wherein the operation count is configured to control the periodic implementation of the refresh operation.

20. The method of claim 15, wherein the memory controller is configured to:
dynamically generate, based on the scan, a shift measure that represents an estimate of charge loss associated with the or more changes in the preloaded data;
implementing the response action based on selecting to:
implementing a refresh operation ahead of a predetermined schedule when the shift measure is within a first range; and
generating a post-deployment message for notifying a user of the or more changes in the preloaded data when the shift measure is within a second range that is greater than the first range.

* * * * *